United States Patent
Jiang et al.

(10) Patent No.: US 7,165,977 B2
(45) Date of Patent: Jan. 23, 2007

(54) ELECTRICAL CONNECTOR WITH FLEXIBLE PRINTED CIRCUIT BOARD

(75) Inventors: Hong-Bing Jiang, Kunshan (CN); Chia-Huang Lin, Taipei (CN); Yong-Hong Tang, Kunshan (CN); Xin Song, Kunshan (CN)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 11/401,081

(22) Filed: Apr. 10, 2006

(65) Prior Publication Data
US 2006/0228913 A1    Oct. 12, 2006

(30) Foreign Application Priority Data
Apr. 8, 2005    (CN) .................. 2005 2 0070599

(51) Int. Cl.
*H01R 12/00* (2006.01)
(52) U.S. Cl. .................. 439/67; 439/493
(58) Field of Classification Search .............. 439/67, 439/77, 493, 951, 948, 492, 499
See application file for complete search history.

(56) References Cited

U.S. PATENT DOCUMENTS

| 6,007,382 | A | 12/1999 | Wu |
| 6,398,587 | B1 | 6/2002 | Chen et al. |
| 2003/0232517 | A1* | 12/2003 | Liu et al. ...................... 439/67 |
| 2004/0038565 | A1* | 2/2004 | Yen .............................. 439/79 |

* cited by examiner

*Primary Examiner*—Tho D. Ta
(74) *Attorney, Agent, or Firm*—Wei Te Chung

(57) ABSTRACT

An electrical connector (1) comprises an insulative housing (10), a conductive member (20) received in the insulative housing, and a Flexible Printed Circuit Cable (70) electrically connecting with the conductive member. The FPC has one end electrically connecting with the conductive member, and the other end comprising a plurality of golden fingers (72) opposite to the insulative housing, and wherein the FPC forms a pair of wings (73) adjacent to the golden fingers, and adapted for preventing excessive insertion of the golden fingers.

11 Claims, 6 Drawing Sheets

ELECTRICAL CONNECTOR WITH FLEXIBLE PRINTED CIRCUIT BOARD

BACKGROUND OF THE INVENTION

1. Field of the Invention

The present invention generally relates to an electrical connector, and more particularly to a Universal Serial Bus Connector with a printed circuit board.

2. Description of Prior Art

Portable electronic devices are found more and more applications in human livings with rapid developments of the science and technology nowadays. A portable electronic device needs to get smaller and smaller on one hand for portability and to incorporate as many electronic components therein as possible on the other hand for multi-function. Thus, electronic components accommodated in the portable electronic device and electrical connectors accommodated in the portable electronic device to connect peripheral electronic components, which are not put in the portable electronic device, to the portable electronic device are all made as small as possible to comply with the miniature of the device.

Universal Serial Bus (USB) connectors are often used to connect peripheral electronic components, such as Hard Disk Drive and CD ROM, to portable electronic devices. A mini USB connector having a small size is widely used in MP3 player. The conventional mini USB connector comprises four contacts for mating with the complementary connector. Normally, a Flexible Printed Circuit Cable (FPC) is needed for connecting another intramural electronic member. However, when the FPC is inserted into the other electrical connector, it is difficult to accurately judge the insertion of the golden finger is at a right position. So, the golden finger is easily broken cause of an overage insertion force.

Hence, it is desirable to have an improved USB connector to overcome the above-mentioned disadvantages of the prior art.

BRIEF SUMMARY OF THE INVENTION

Accordingly, the object of the present invention is to provide an electrical connector with golden fingers which are not easily broken by an insertion force.

Another object of the present invention is to provide an FPC Cable having golden fingers which are not easily broken by an insertion force.

In order to achieve the above-mentioned object, an electrical connector, comprises an insulative housing, a conductive member received in the insulative housing, and a Flexible Printed Circuit Cable electrically connecting with the conductive member. The FPC has one end electrically connecting with the conductive member, and the other end comprising a plurality of golden fingers opposite to the insulative housing, and wherein the FPC forms a pair of wings adjacent to the golden fingers, and adapted for preventing excessive insertion of the golden fingers.

Other objects, advantages and novel features of the invention will become more apparent from the following detailed description of the present embodiment when taken in conjunction with the accompanying drawings.

DETAILED DESCRIPTION OF THE INVENTION

Figure 1:
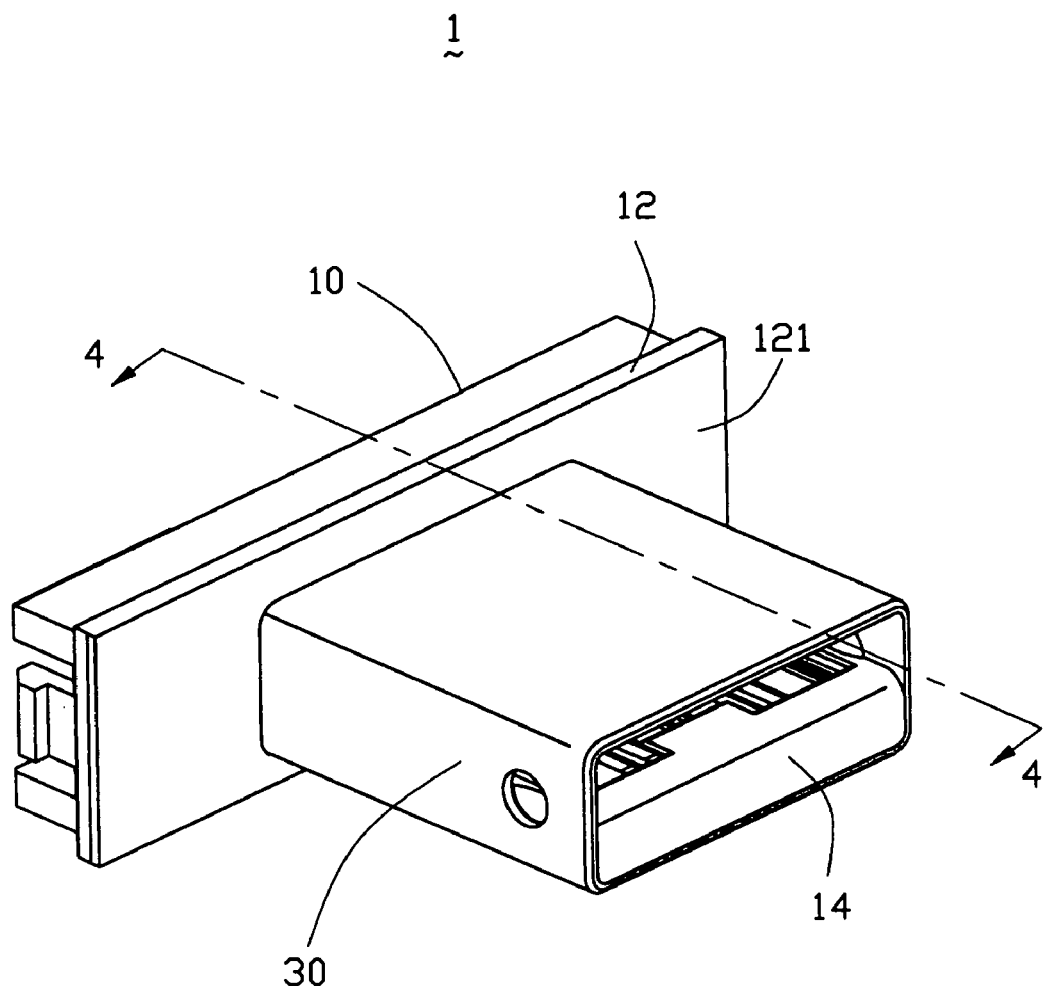
FIG. 1 is a perspective view of an electrical connector in accordance with the present invention.

Reference will now be made to the drawing figures to describe the present invention in detail.

Figure 3:
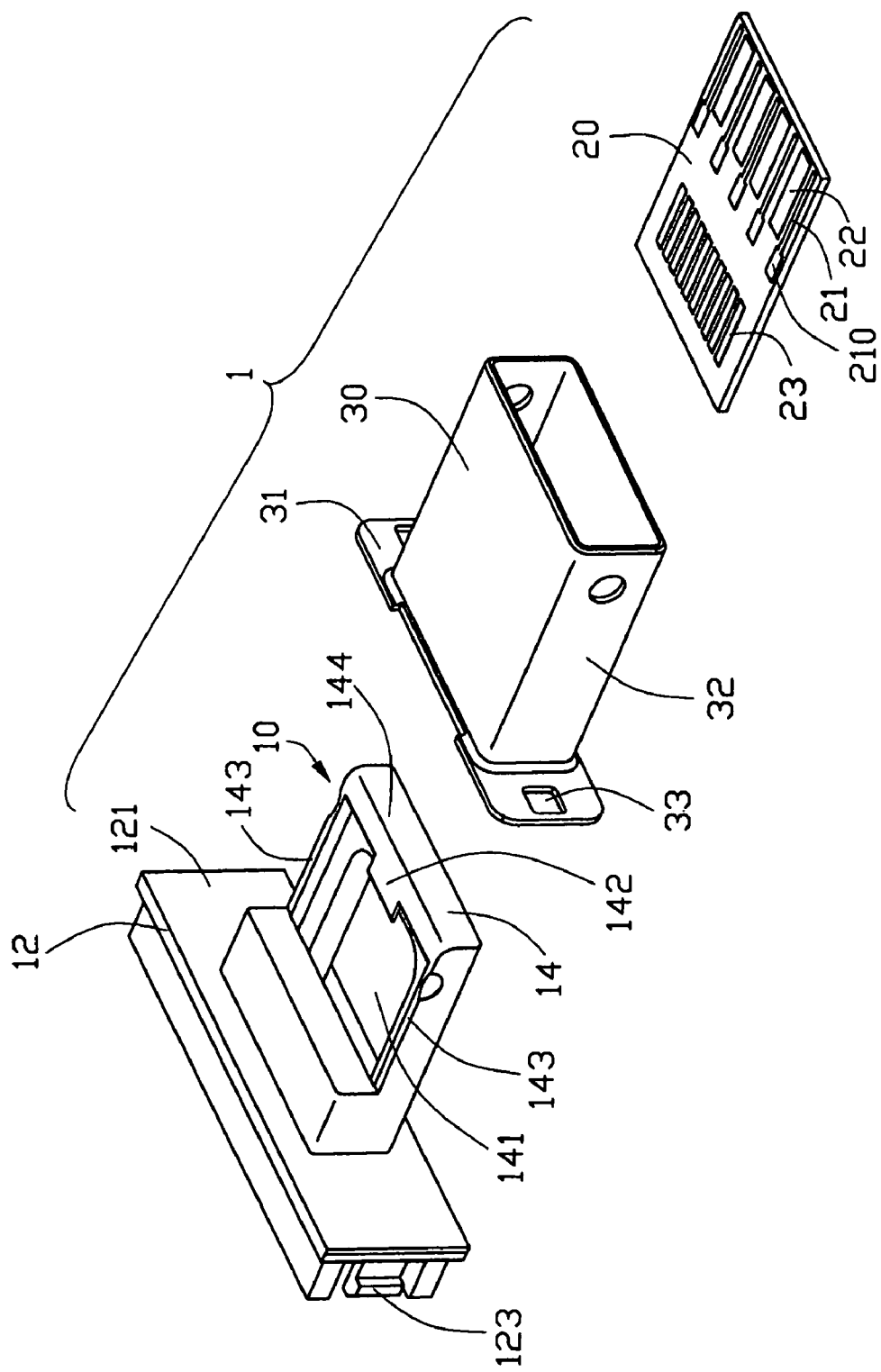
FIG. 3 is an exploded, perspective view of the electrical connector shown in FIG. 1.
Figure 4:
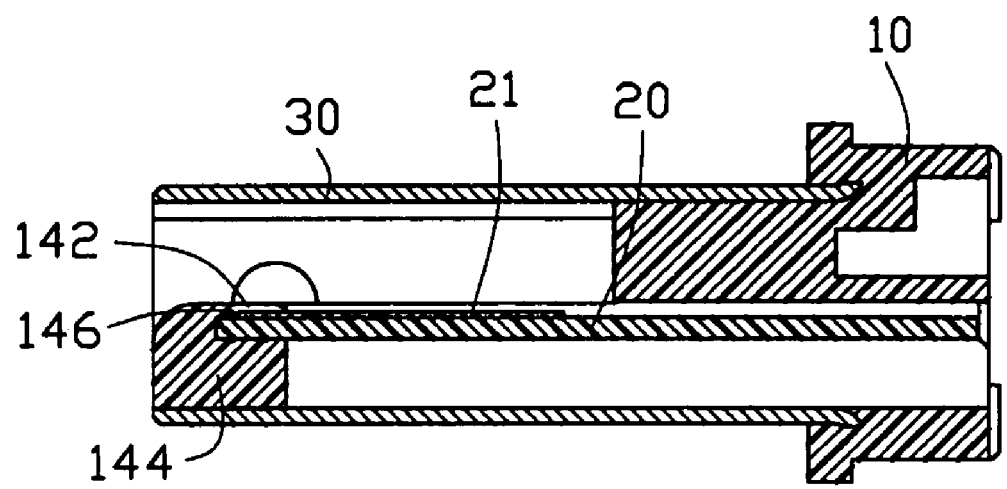
FIG. 4 is a cross-section view taken along line 4—4 of the electrical connector shown in FIG. 1.

Referring to FIGS. 1 and 3, an electrical connector 1 in accordance with the present invention comprises an insulative housing 10, a printed circuit board (PCB) 20 received in the insulative housing 10 and a shell 30 enclosing the insulative housing 10.

Figure 2:
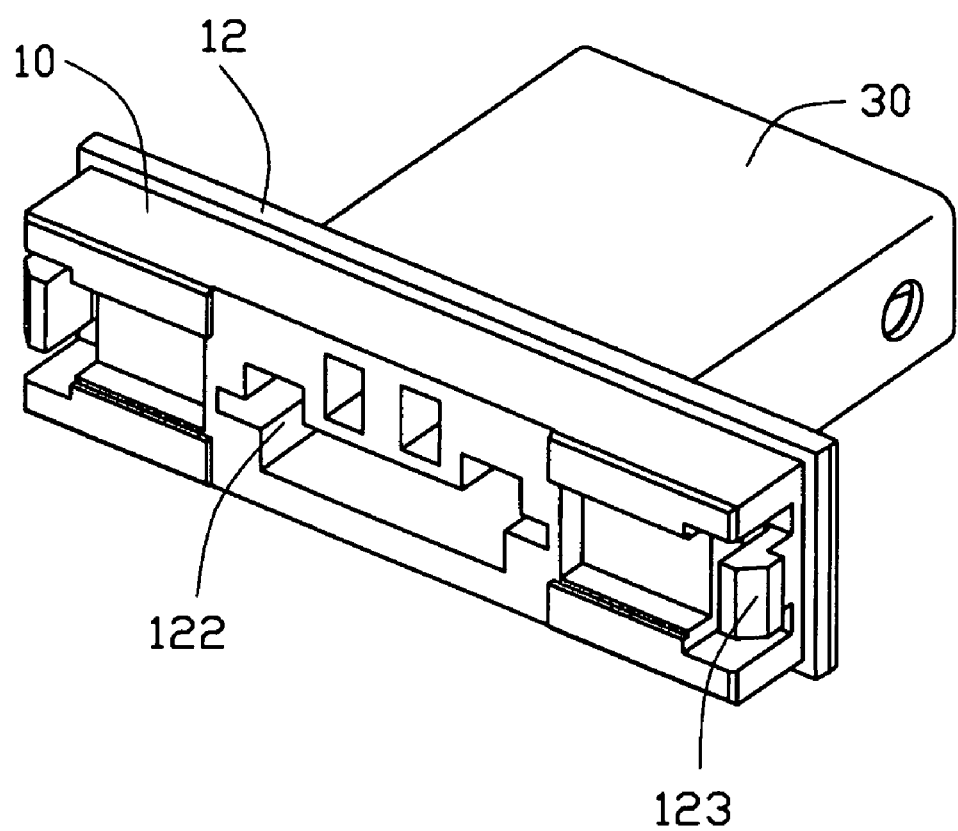
FIG. 2 is a view similar to FIG. 1, but taken from a different aspect.

Joining with FIGS. 2 and 3, the insulative housing 10 comprises a rectangular base portion 12, and a tongue-shape supporting bracket 14 extending forwardly therefrom. The base portion 12 has a receiving passage 122 extending therethrough along a front-to-back direction. A pair of latches 123 are formed at the lateral ends of the base portion 12, respectively, for engaging with an equipment (not shown). The supporting bracket 14 defines a cutout 141 in a center thereof communicating with the passage 122, a pair of lateral arms 143 and a front portion 144 surrounding the cutout 141. The supporting bracket 14 is partially cut from a top surface thereof to form a supporting portion (not labeled). A guiding portion 142 extends rearwardly from the center of the top surface of the front portion 144.

The shell 30 is seamless and fabricated by deep draw process. The shell 30 comprises a frame portion 32 and a pair of lateral ears 31 extending from the frame portion 32 outwardly. Each lateral ear 31 has a hole 33 thereon.

The PCB 20 forms a plurality of conductive pads thereon. The conductive pads comprise five first conductive pads 21, four second conductive pads 22, and nine third conductive pads 23. The first conductive pads 21 and second conductive pads 22 are disposed at a front end of the PCB 20 and alternately along a lateral direction perpendicular to said front-to-back direction. The third conductive pads 23 are positioned at a rear portion of the PCB 20 opposite to the first and second pads 21, 22. The four second conductive pads 22 can be used as a common USB connector. A contact area 210 of the first pads 21 is located behind that of the second pad 22 along said front-to-back direction. The contact area 210 of the first pads 21 essentially is aligned and not dimensionally consistent with a corresponding contact segment thereof along said front-to-back direction and contact area of the second pads 22 is aligned but dimensionally consistent with a corresponding contact segment thereof along said front-to-back direction. The contact area 210 of each first pad 21 is wider than that of the corresponding contact segment thereof.

Figure 5:
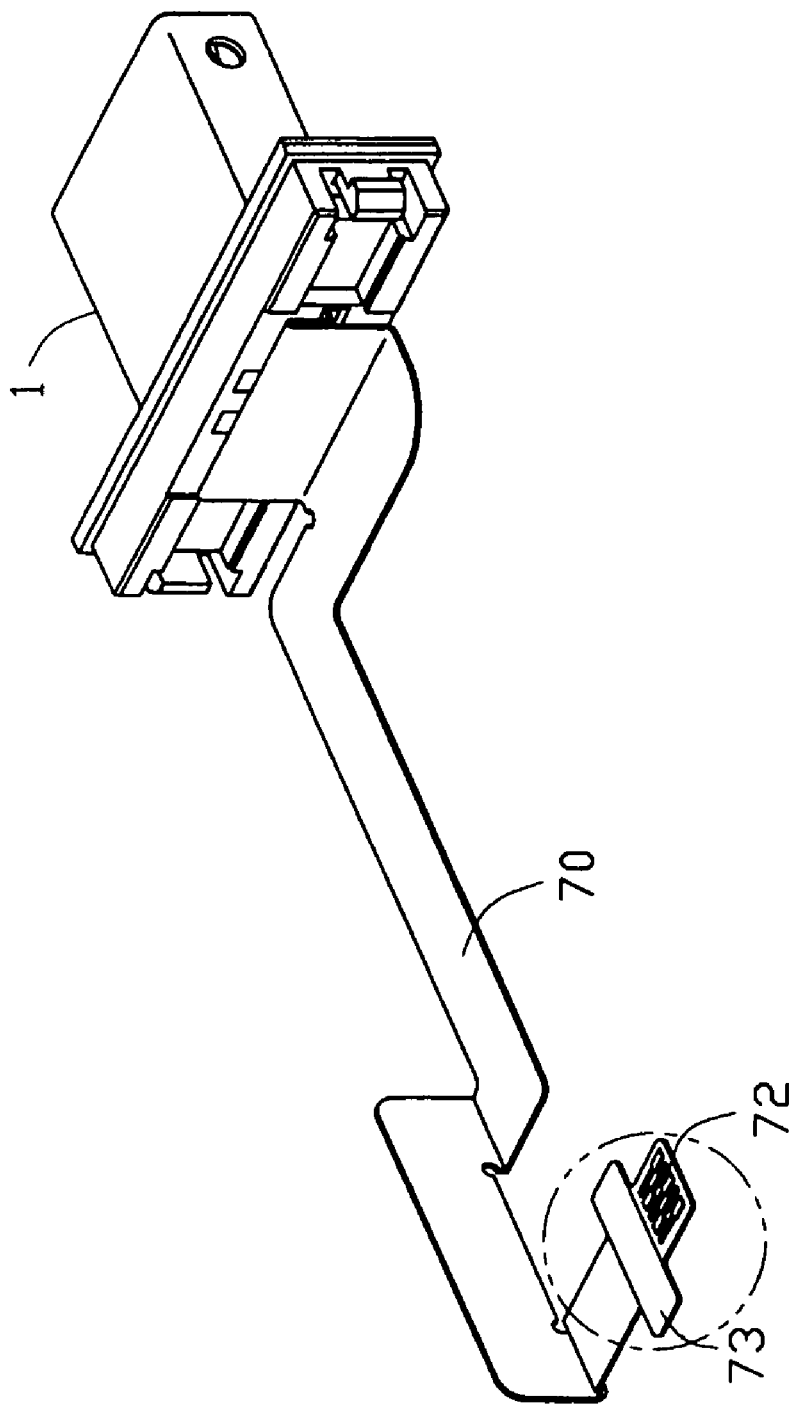
FIG. 5 is a perspective view of an electrical connector with a Flexible Printed Circuit Cable.
Figure 6:
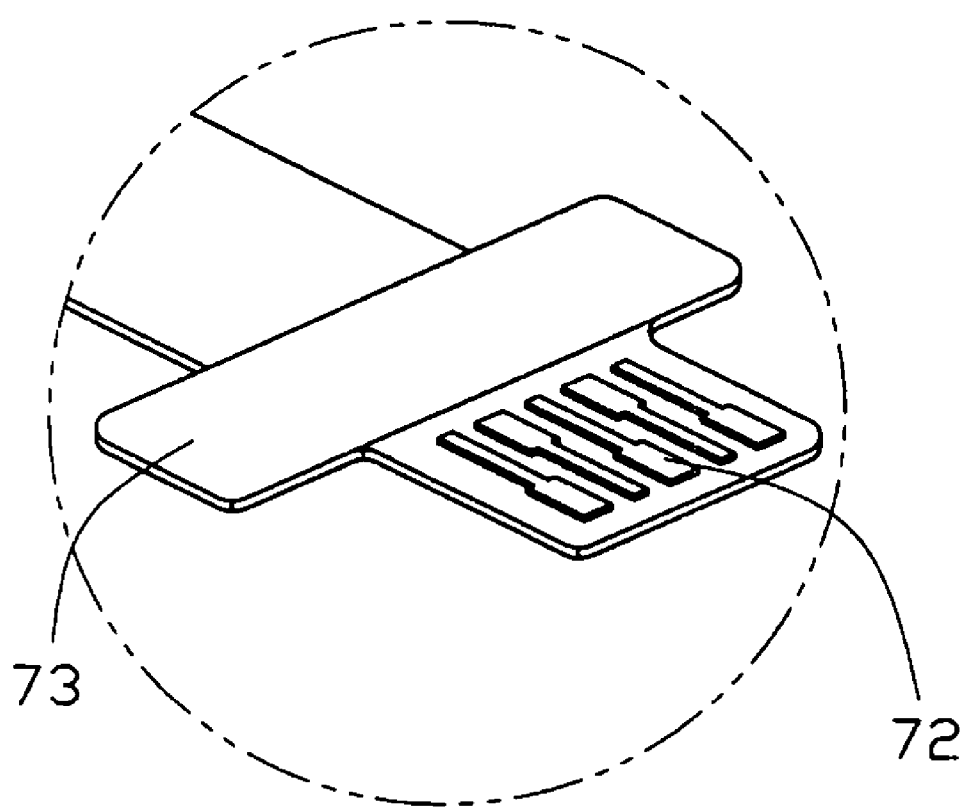
FIG. 6 is a enlarge perspective view of area a shown in FIG. 5.

Referring to FIG 5, the Flexible Circuit Cable 70 comprises a base plate (not labeled), printed circuit made of copper (not shown), and a plurality of golden fingers 72 formed at opposite ends thereof. The rear end of the golden fingers 72 and opposite face of the FPC to the golden fingers spread a enhance layer (not labeled) such as a glue layer. A pair of wings 73 are formed at the rear end of the golden fingers 72. One end of the FPC 72 electrically connects with the third soldering pads 23 of the electrical connector 1. The other end of the FPC 70 is inserted into an intramural electronic member (not shown). Because of the existence of the wings 73, it is easy to judge whether the FPC 70 is inserted at a right position or not so as to avoid the golden fingers 72 broken cause of an overage force.

During assembly, the lateral ears 31 of the shell 30 are inserted-molded with the base portion 12 of the insulative housing 10, and the frame portion 32 encloses the supporting bracket 14 of the insulative housing 10. The shell 30 and the supporting bracket 14 define a mating cavity 147 along the front-to-back direction for mating and unmating. The holes 33 increase the retaining force between the shell 30 and the insulative housing 10. The PCB 20 is inserted into the passage 122 of the base portion 12 of the insulative housing 10 along a back-to-front direction, and is located above the cutout 141, and is supported by supporting portion of the supporting bracket 14. A front edge of PCB 20 is partially located below 14, thus, the top surface of 14 is higher than the conductive pads 21, 22. The first conductive pad 21 forms a first mating interface for mating with a first connector (not shown), the first and the second conductive pads 21, 22 together form a second mating interface for mating with a second connector (not shown).

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An electrical connector, comprising:
    an insulative housing;
    at least one conductive member received in the insulative housing adapted for electrically connecting with complementary connector; and
    a Flexible Printed Circuit Cable (FPC) having one end electrically connecting with the conductive member, and the other end comprising a plurality of golden fingers opposite to the insulative housing;
    and wherein the FPC forms at least one wing located adjacent to the golden fingers, and configured to prevent excessive insertion of the golden fingers;
    and wherein there are two of said least one wing, located on two opposite sides of said golden fingers;
    and wherein the at least conductive member is a printed circuit board (PCB).

2. The electrical connector as claimed in claim 1, wherein the insulative housing comprises a guiding portion extending from the center of the top surface of a front portion of the insulative housing.

3. The electrical connector as claimed in claim 1, wherein the PCB comprises a plurality of first conductive pads, a plurality of second conductive pads alternately disposed in a mating cavity of the insulative housing along a lateral direction perpendicular to said front-to-back direction, and a plurality third conductive pads opposite to the first and second conductive pads along front-to-back direction, and electrically connect with said one end of the FPC.

4. The electrical connector as claimed in claim 3, wherein said the other end of the golden fingers and opposite face of the FPC to the golden fingers are spread with an enhance layer.

5. The electrical connector as claimed in claim 4, wherein the wings is formed by the enhance layer.

6. The electrical connector as claimed in claim 4, wherein each second conductive pad is positioned between the two first conductive pads.

7. The electrical connector as claim 4, wherein the second conductive pads can be used as a common USB connector.

8. The electrical connector as claim 1, wherein the electrical connector comprises a shell comprises the insulative housing.

9. The electrical connector as claim 8, wherein the shell has a lateral ear insert-molded with the insulative housing.

10. An electrical connector assembly comprising:
    an electrical connector;
    a flexible printed circuit cable connected to said connector, said flexible printed circuit cable defining a plurality of juxtaposed gold fingers each having a wider section and a narrow section, said gold fingers being aligned with one another along a transverse direction while being inversely arranged for every adjacent two.

11. The assembly as claimed in claim 10, wherein said flexible printed circuit cable defines two laterally projection sections behind said gold fingers.

* * * * *